United States Patent [19]
Chen et al.

[11] Patent Number: 6,025,255
[45] Date of Patent: Feb. 15, 2000

[54] TWO-STEP ETCHING PROCESS FOR FORMING SELF-ALIGNED CONTACTS

[75] Inventors: Bi-Ling Chen; Erik S. Jerry; Daniel Hao-Tien Lee, all of Taipei, Taiwan

[73] Assignee: Vanguard International Semiconductor Corporation, Hsin-Chu, Taiwan

[21] Appl. No.: 09/105,106

[22] Filed: Jun. 25, 1998

[51] Int. Cl.[7] .................................................. H01L 21/306
[52] U.S. Cl. .......................... 438/595; 438/238; 438/256; 438/397; 438/398; 438/399; 438/692; 438/697; 438/711; 438/712; 438/723; 438/724; 438/734; 438/743; 438/744
[58] Field of Search ...................................... 438/238, 253, 438/256, 381, 396–399, 735, 595, 711–713, 723–725, 695–697, 706, 712, 691, 692, 743–744, 734

[56] References Cited

U.S. PATENT DOCUMENTS

| | | | |
|---|---|---|---|
| 5,286,344 | 2/1994 | Blalock et al. | 156/657 |
| 5,423,945 | 6/1995 | Marks et al. | 156/662.1 |
| 5,431,778 | 7/1995 | Dahm et al. | 156/662.1 |
| 5,780,338 | 7/1998 | Jeng et al. | 438/253 |
| 5,795,820 | 8/1998 | Kepler | 438/624 |
| 5,869,404 | 2/1999 | Kim et al. | 438/738 |
| 5,872,063 | 2/1999 | Chao et al. | 438/762 |
| 5,920,796 | 7/1999 | Wang et al. | 438/700 |

*Primary Examiner*—Charles Bowers
*Assistant Examiner*—Thanh Nguyen
*Attorney, Agent, or Firm*—George O. Saile; Stephen B. Ackerman

[57] ABSTRACT

The practice of forming self-aligned contacts in MOSFETs using a silicon nitride gate sidewall and a silicon nitride gate cap has found wide acceptance, particularly in the manufacture of DRAMs, where bitline contacts are formed between two adjacent wordlines, each having a nitride sidewall. The contact etch requires a an RIE etch having a high oxide/nitride selectivity. Current etchants rely upon the formation of a polymer over nitride surfaces which enhances oxide/nitride selectivity. However, for contact widths of less than 0.35 microns, as are encountered in high density DRAMs, the amount of polymer formation required to attain a high selectivity causes the contact opening to close over with polymer before the opening is completely etched. This results in opens or unacceptably resistive contacts. On the other hand, if the etchant is adjusted to produce too little polymer, the nitride cap and sidewalls are thinned or etched through, producing gate to source/drain shorts. The invention describes a two step etching process whereby the contact opening is initially etched at high selectivity, and then, as the contact channel narrows, the polymer formation rate is reduced to prevent polymer pinch off and assure clearance of insulator in the contact area. The method performs both etch steps and the polymer and photoresist removal successively within the same RIE tool.

25 Claims, 6 Drawing Sheets

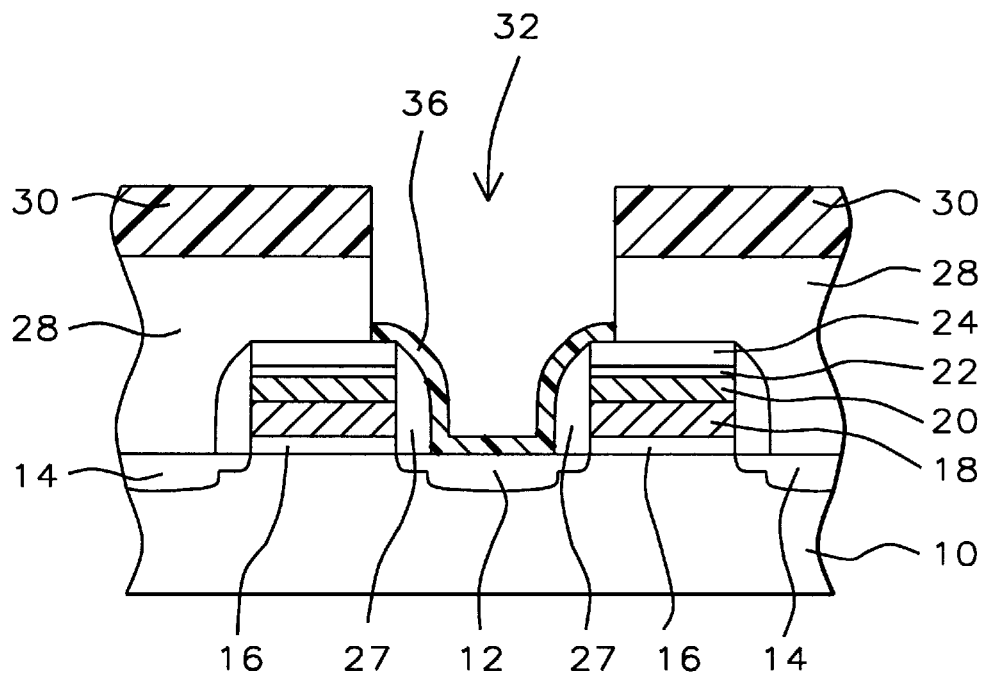
FIG. 1 – Prior Art
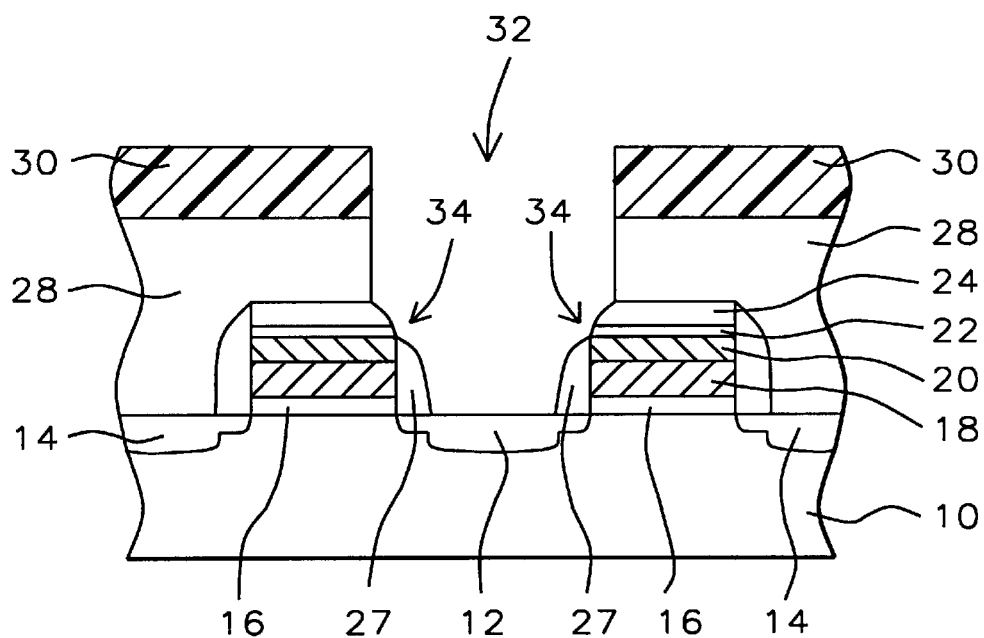
FIG. 2 – Prior Art

TWO-STEP ETCHING PROCESS FOR FORMING SELF-ALIGNED CONTACTS

RELATED PATENT APPLICATION

VIS-86-035, S/N 09/089,557, F/D Jun. 3, 1998, "METHOD OF SELF-ALIGNED CONTACT HOLE ETCHING BY FLUORINE-CONTAINING DISCHARGES", B. L. Chen and E. S. Jeng assigned to a common assignee.

BACKGROUND OF THE INVENTION (1) Field of the Invention

The invention relates to processes for the manufacture of semiconductor devices and more particularly to the etching of contact openings in the manufacture of sub-micron MOSFETs.

(2) Background of the Invention and Description of Prior Art

The fabrication of integrated circuit chips comprises the formation of semiconductor devices within the surface of a single crystalline silicon wafer. The semiconductive elements of metal-oxide-silicon-field-effect-transistors (MOSFETs) are contained within the surface of the single crystalline substrate wafer and are formed by ion-implantation using the control electrode, a polysilicon gate formed over the substrate, as an implantation mask. The source and drain regions of the MOSFET are thereby self-aligned to the gate electrode.

Many variations of the principle of self alignment to the polysilicon gate have been developed to improve device performance and stability, in particular, the use of side walls along the edges of the polysilicon gate have permitted the tailoring of source and drain diffusions at the ends of the channel region to control short channel effects. These advances in MOSFET processing have resulted in high performance sub-micron sized devices of many types. The lightly-doped-drain (LDD) structure, used universally in sub-micron MOSFET technology, is a notable example of this side-wall tailoring.

The use of insulative sidewalls and caps over polysilicon conductors has also permitted the formation of self-aligned contacts (SAC) to MOSFET active elements. Self-alignment processing utilizes reactive-ion-etching (RIE) to anisotropically etch vertical walled openings, typically through insulative layers, such as silicon oxide and various silicate glasses.

Self-aligned-contacts can be made in various configurations. Typically an insulative sidewall is provided along the edge of the polysilicon gate electrode. The sidewall provides an insulative spacing between the contact and the polysilicon gate. Referring to FIG. 1 there is shown a cross section of a silicon wafer with two adjacent MOSFETs. The configuration shown here is typical of a well known design (DASH Cell) for a dynamic random access memory (DRAM) cell. The polysilicon gate electrodes 18 form the wordlines of the DRAM. The source/drain diffusions 12, 14 are formed by the widely used LDD process utilizing the sidewalls 27. In subsequent processing steps, storage capacitors are formed over the semiconductive elements 14 while a bitline contact is made to the semiconductive element 12.

The polysilicon word lines in this example have a tungsten silicide layer 20 and a thin silicon oxide layer 22 over them. The sidewalls 27 and a top protective layer 24 are formed of silicon nitride. These layers are formed and patterned by conventional modern processing techniques well known to those in the art. An insulative layer 28, for example silicon oxide is deposited over the wafer and planarized by any of several well known techniques, for example chemical mechanical polishing (CMP). An opening for the bitline contact is then defined using well known photolithographic processing, whereby a pattern is formed in a photoresist layer 30. The photomask opening can be made larger than the contact area at the silicon surface. The self-alignment feature permits a slight mis-alignment of the photomask because the contact at the silicon is determined by the nitride sidewall 27.

The wafer 10 is then subjected to an RIE processing step whereby the opening 32 for the bitline contact is etched in the insulative layer 28. The etchant gas and the RIE parameters are selected to provide vertical walls in the opening in the silicon oxide layer and a high silicon oxide etch rate selectivity, that is to say, a high silicon oxide to silicon nitride etch rate ratio. The opening illustrated in FIG. 1 was formed with an etch rate sensitivity so high that the nitride sidewalls 27 and the exposed upper portions of the nitride top cap 24 are imperceptibly etched.

Under conditions of inadequate etch rate selectivities the nitride sidewalls 27 and top nitride cap 24 etch at rates whereby the insulative spacing provided by these elements is reduced by erosion of the nitride, resulting in subsequent shorts between bitline and wordline. This is illustrate in FIG. 2 Where the upper corners 34 of the wordlines have been exposed.

Until recently, etch rate selectivities greater than about 8:1 were not attainable without sacrificing other important aspects such as etching anisotropy. In the current technology, where dimensional features are of the order of quarter micron, it becomes increasingly more difficult to achieve a sufficiently high etch rate selectivity for this contact opening etch without aggravating deleterious side effects, for example incomplete oxide removal at the base of the contact resulting in unacceptable contact resistance.

It is widely believed that polymer formation in an RIE plasma containing fluorocarbon etchants, is largely responsible not only for etching anisotropy but also for the etch rate selectivities. The polymer contains fluorine and carbon. In the case of silicon oxide etching, the polymer formed at the etching front is rapidly dissociated by the released oxygen. However, over regions of silicon nitride, the oxygen concentration is less and the polymer is not readily dissociated, thereby providing passivation of the silicon nitride.

In order to achieve the high etch rate sensitivity to achieve the profile shown in FIG. 1, it was necessary to utilize etchant gases and RIE parameters which provided a relatively high steady state polymer thickness. The residual polymer 36 is shown prior to its removal at the termination of the etching operation. Insufficient steady state polymer thickness leads to the profile shown in FIG. 2.

Bialock, et.al., U.S. Pat. No. 5,286,344 cites the use of high etch rate selectivities for silicon oxide over silicon nitride utilizing a continuous nitride layer beneath the oxide layer which acts as an etch stop. A single step etch process is used wherein the oxide/nitride etch rate selectivity of a conventional $CF_4$, $CHF_3$, Ar gas mixture is raised from 1.2:1 to 30:1 by the addition of $CH_2F_2$. The increase in selectivity is attributed to polymer deposition over the nitride. The selection of the additive gas such as $CH_2F_2$ is made according to a rule wherein the number of hydrogen atoms must be equal to or greater than the number of fluorine atoms.

Marks, et.al., U.S. Pat. No. 5,423,945 have found that reducing the fluorine content of the passivation polymer, and reducing the amount of free fluorine in the plasma, reduces the dissociation of the polymer. By adding a fluorine scavenger such as silicon or carbon ions to the plasma, the resultant polymer becomes carbon rich and is more resistant to dissociation. In an example, an etch rate selectivity of oxide to nitride of 15:1 was achieved by the use of a fluorine scavenger.

Dahm, et.al., U.S. Pat. No. 5,431,778 does not use halogenated hydrocarbon gases for etching silicon oxide. Instead gas mixtures containing combinations of $F_2$, $O_2$, $CO_2$, HF, and $CH_4$ are employed. $CH_4$ or $CO_2$ provides carbon for polymer formation over nitride regions increasing the selectivity. Although specific oxide/nitride selectivities are not cited, the extent of polymer formation is attributed to the amount of oxygen present in the chamber.

One of the problems incurred during etching of very small (<0.35 μm) contact openings at high selectivities is that the heavy polymer formation interferes with the proper clearing of oxide at the base of the contact opening to expose the silicon surface. The residual oxide in the opening results in inconsistent and unacceptably high contact resistance. This problem is not addressed by any of the references cited.

FIG. 3 shows an profile of a contact opening which has been etched using high etch rate selectivitities comparable to those used to attain the profile shown in FIG. 1. However, the width of the contact opening 40 is less than or equal to 0.15 μm. The steady state polymer thickness pinches off access of the reactant gases to the underlying oxide layer 38, resulting in incomplete clearance of oxide. In an intermediate case, the etchant may penetrate the oxide layer in the center but be pinched off before sufficient area of the silicon surface was cleared leaving pockets of residual oxide around the periphery of the contact opening. The residual oxide in the opening will cause an open or unacceptable and erratic high resistance contacts.

The need to consider reduction of the rate of polymer formation as the etch front enters the narrow region of the contact opening between the nitride sidewalls arises when the steady state polymer thickness comes within range of the width of the contact opening. Steady state polymer thicknesses required to achieve etch rate selectivities of oxide to nitride of the order of 15:1, become intrusive when contact openings are less than 0.15 μm in their smallest dimension.

SUMMARY OF THE INVENTION

It is an object of this invention to provide an improved method for forming self aligned contact openings in integrated circuits.

It is another object of this invention to provide an effective recipe for reactive ion etching of openings in insulative layers utilizing initial high etch rate selectivities, and without compromising the complete clearance of insulative material at the base of the openings by polymer encroachment.

It is yet another object of this invention to provide a recipe for etching self-aligned contacts in semiconductor integrated circuits whereby residual polymer and photoresist are removed in-situ subsequent to the insulative layer etching.

These objects are accomplished by varying the etching characteristics within the RIE reactor during the course of the etching step by controlling the rate of polymer formation. The procedure provides a first period during which a high etch rate selectivity of oxide to nitride is achieved by condition which cause heavy formation of polymer. These conditions are maintained until the contact opening has been etched to a pre-determined depth past the upper portions of the nitride sidewalls and into the narrower portion of the sel-aligned contact opening. At this point a second period is begun wherein the gas composition is altered and the applied rf power is increased to reduce the rate of polymer buildup, thereby reducing the encroachment of polymer into the narrower opening.

BRIEF DESCRIPTION OF THE DRAWINGS

FIG. 1 is a cross sectional view showing a portion of a DRAM cell wherein a self-aligned bitline contact opening has been etched into an insulative layer by a single step etch having a high oxide/nitride selectivity without.

FIG. 2 is a cross sectional view showing a portion of a DRAM cell wherein a self-aligned bitline contact opening has been etched into an insulative layer by a single step etch having a low oxide/nitride selectivity.

DESCRIPTION OF THE PREFERRED EMBODIMENTS

Figure 3:
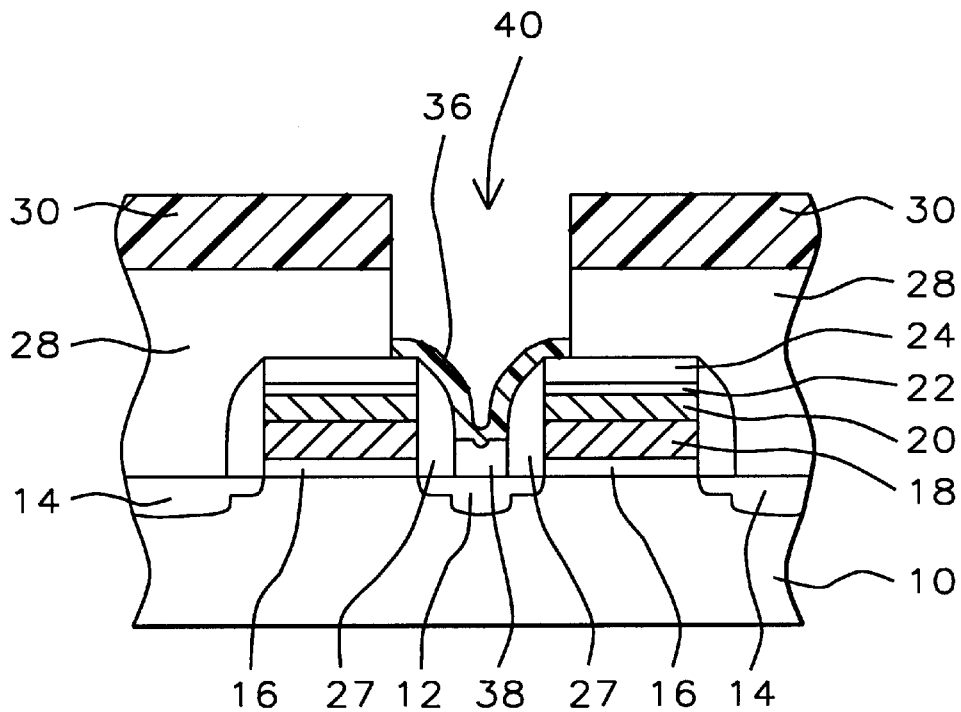
FIG. 3 is a cross sectional view showing a portion of a DRAM cell wherein a self-aligned bitline contact opening of smaller dimensions than that shown in FIGS. 1 and 2, has been etched into an insulative layer by a single step etch having a high oxide/nitride selectivity.
Figure 4A:
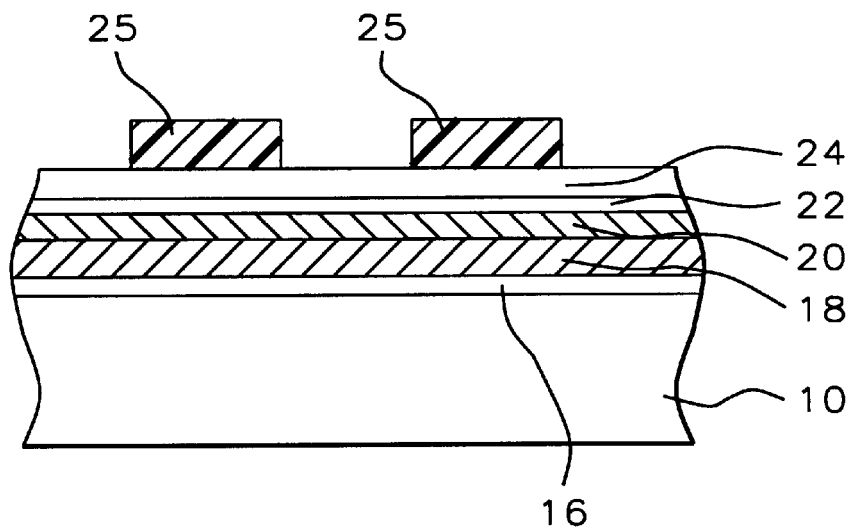
FIG. 4A through FIG. 4G are cross sectional views of a portion of a DRAM cell illustrating a progression of processing steps for forming a self-aligned bitline contact according to a preferred embodiment of the current invention.

In a preferred embodiment of this invention a bitline contact in a DRAM cell is formed between two adjacent wordlines. Referring to FIG. 4A an 8 inch diameter silicon wafer 10 having a doped polysilicon 18 over a gate oxide 16 is provided. The doped polysilicon layer 18 may be of composite form, and may have an additional conductive layer 20 of a silicide, for example $WSi_x$ over it. The polysilicon layer 18 is deposited by well known chemical vapor deposition (CVD) methods and is made conductive by doping with an impurity during deposition or subsequently by ion implantation. The polysilicon layer 18 is between about 50 and 150 nm thick. A layer of silicon oxide 22 is deposited, by a CVD method such as the thermal decomposition of tetraethoxyorthosilicate (TEOS) The silicon oxide layer 18 is between about 20 and 50 nm thick. A cap layer 24 of silicon nitride is next deposited over the silicon oxide layer 22. This layer 24 is between about 150 and 250 nm thick, and is deposited by CVD using well known precursors such as silane and ammonia.

Figure 4B:
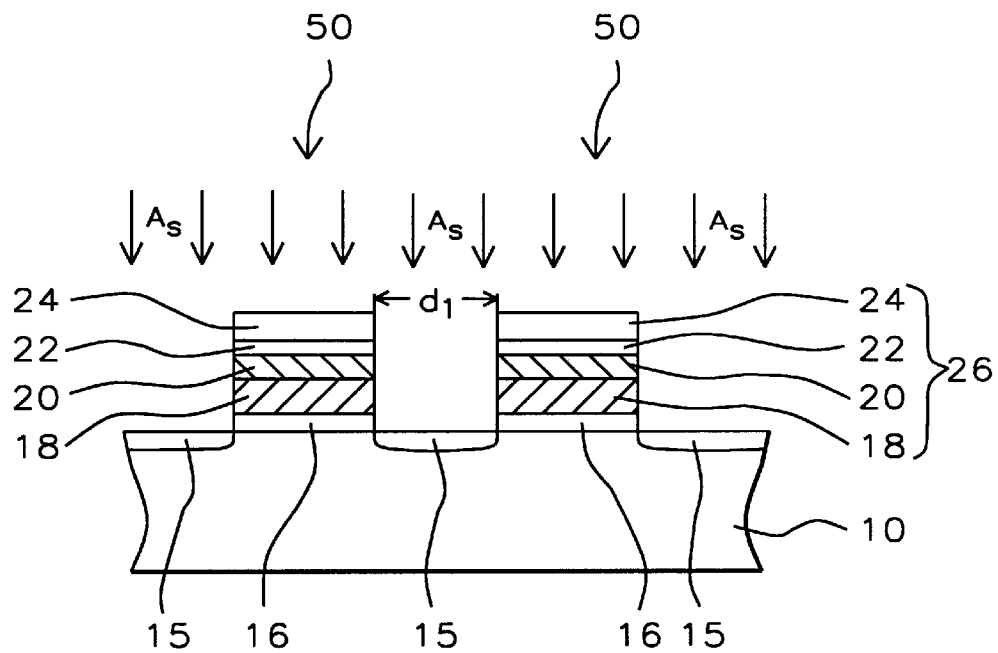

Wordlines which form the gate electrodes of the MOSFETs are next patterned in a photoresist layer 25 using well known state of the art photolithographic techniques and the MOSFET gate stack is anisotropically etched by RIE. Referring to FIG. 4B, there is shown a cross section of the DRAM cell portion after the wordlines 50 have been formed by the RIE and the residual photoresist has been removed, either by ashing or by conventional photoresist strippers. The layers 16, 18, 20, 22, 24 comprise a gate stack 26. The overall height of the gate stack is between about 230 and 500 nm. The spacing $d_1$ between wordlines in current sub-micron DRAM designs is typically between about 0.18 and 0.35 microns.

An ion implant is next performed using arsenic ions at a dose of between about $10^{12}$ and $10^{14}$ atoms/$cm^2$ and an energy of between about 20 and 40 keV, thereby forming the lightly doped drains 15.

Figure 4C:
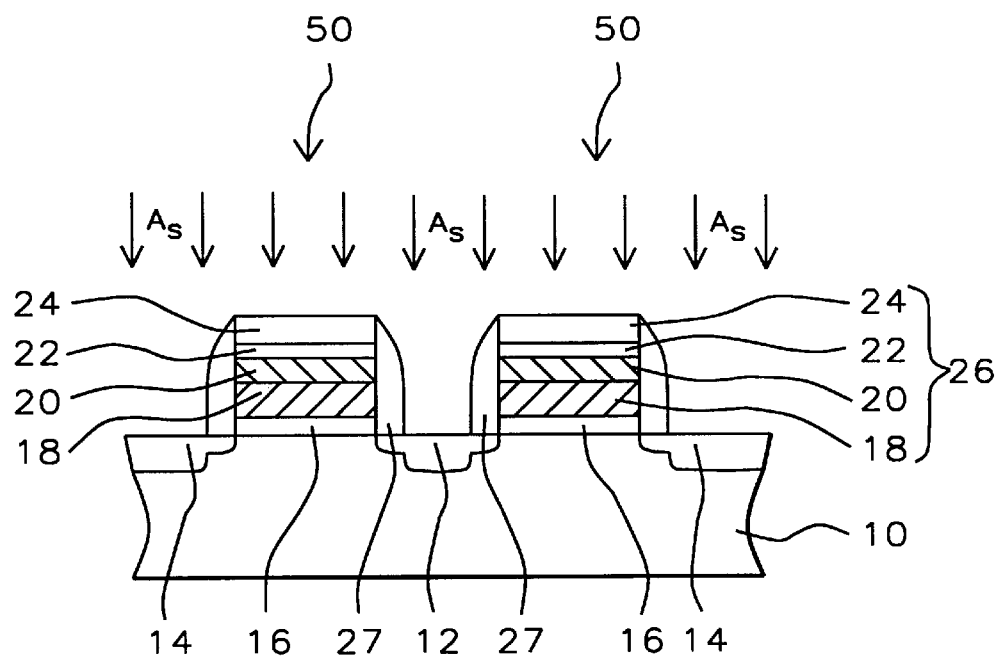

Referring now to FIG. 4C, silicon nitride sidewalls 27 are formed adjacent to the wordline structures 50 by a well known method whereby a conformal layer of silicon nitride is deposited by CVD to a thickness corresponding to the desired sidewall thickness. In order to reduce interfacial stress, a thin pad oxide layer (not shown) may be deposited prior to the deposition of the nitride layer. This layer is then etched back anisotropically by RIE, leaving the sidewalls 27 adjacent to the wordline structures 50. The sidewalls function, not only to define the lightly-doped-drain (LDD) structure, but they also space the self-aligned contact away from the polysilicon gate and the LDD region. In the current DRAM design the thickness of the silicon nitride sidewalls 27 are between about 50 and 100 nm. at their base.

After the sidewalls 27 are in place, the wafer 10 is implanted with arsenic at a dose of between about $10^{13}$ and $10^{15}$ atom s/cm$^2$ and an energy of between about 30 and 50 keV. This deeper and heavier implant forms the source and drain regions 12, 14 of the now completed MOSFETs whose gates comprise the wordlines 50.

Figure 4D:
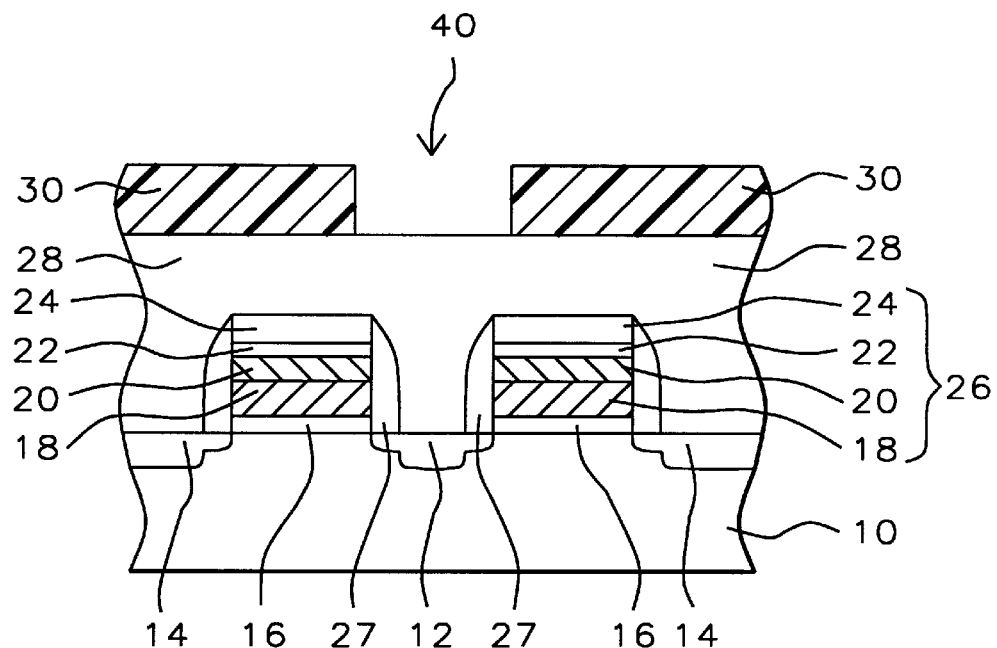

Referring next to FIG. 4D, an insulative layer 28 is deposited over the wafer 10. This layer may be composite, having a lower portion of low pressure CVD (LPCVD) silicon oxide over which a layer of phosphosilicate glass or borophosphosilicate glass is deposited. It may also consist entirely of silicon oxide. It is deposited to a total thickness of between about 800 and 1,000 nm. After deposition the layer 28 is planarized to remove topological features which are replicated on its surface after deposition. This is accomplished, preferably by CMP. Thermal flowing of the silicate glass may also be used to planarize the insulative layer 28. A photoresist layer 30 is next deposited and patterned, preferrably by well state of the art laser photolithography, to define a bitline contact opening 40.

The wafer is then placed into the chamber of an HDP (high density plasma) etching tool. An appropriate commercially available HDP etcher is manufactured by Applied Materials, Inc. of Santa Clara Calif. The wafer is subjected to four successive and distinct processing operation while in the RIE reactor. These processing operations will now be described with reference to the cross sections of FIGS. 4E and 4F and the chart of FIG. 5 which shows variation of gas flow rates and rf power with time during the four step cycle in the RIE reactor.

After an initial pumpdown to about $10^{-6}$ Torr or below the first etching step is begun. An etchant gas mixture containing fluorocyclobutane ($C_4F_8$) at between about 10 and 15 SCCM and $CH_3F$ at between about 8 and 15 SCCM is admitted in an argon carrier gas at between about 50 and 100 SCCM to maintain a total chamber of between about 2 and 10 mTorr. An rf plasma is struck at power of 1,500 Watts or thereabout. This corresponds to a power density of about 4.6 Watts/cm$^2$ for an 8 inch diameter wafer. Under these conditions vertical sidewalls are achieved and the oxide/nitride etch rates are in a ratio of about 20:1.

Figure 4E:
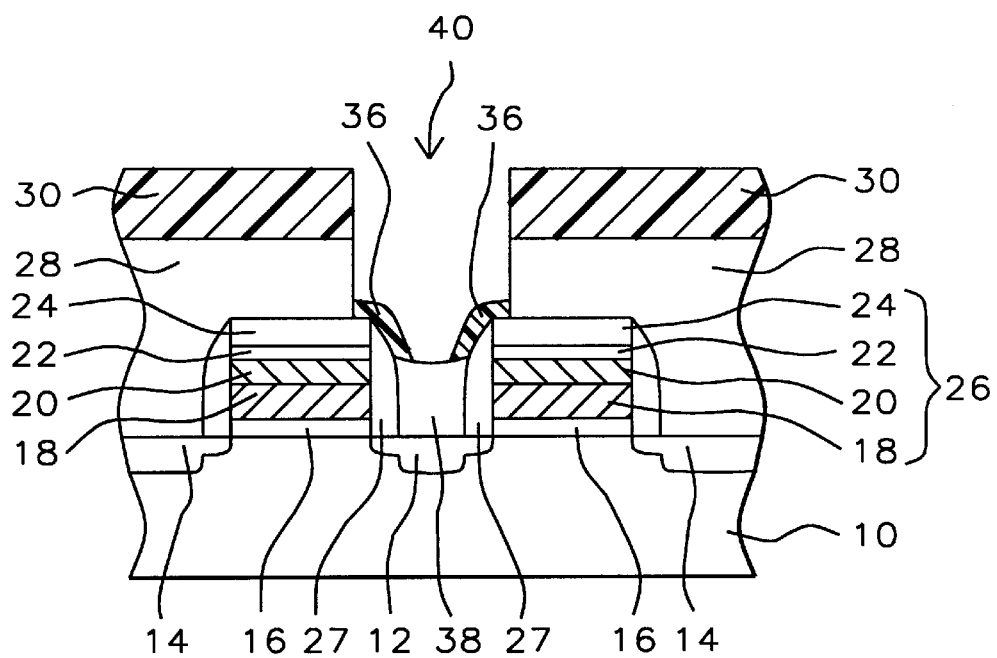
Figure 4F:
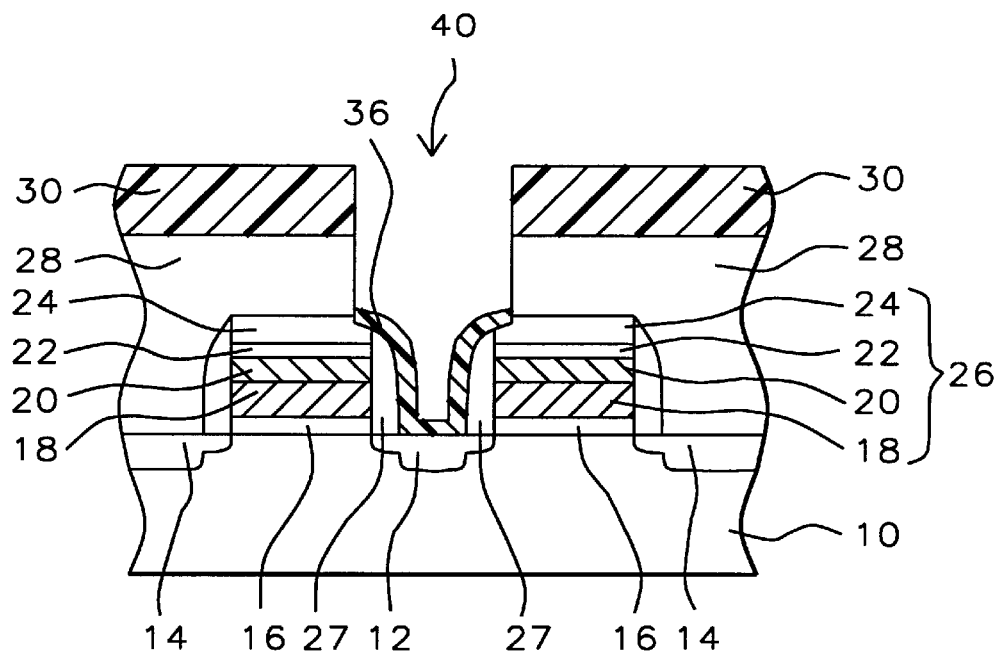
Figure 5:
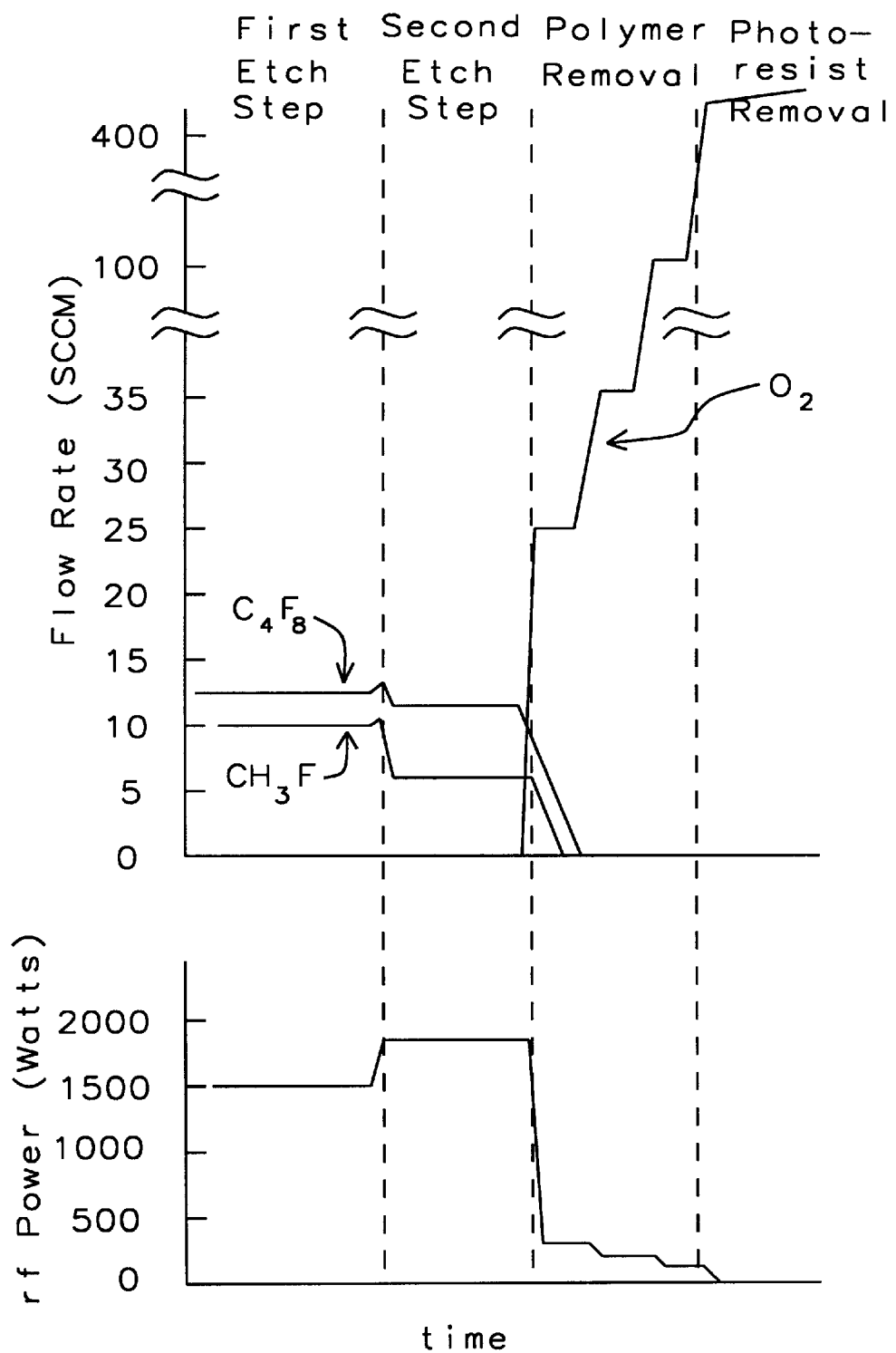
FIG. 5 is a chart showing the flow rates of etchant gases and applied rf power density as a function of time as taught by the method of the current invention.

Etching at these conditions results in a relatively thick steady state polymer buildup over the silicon nitride top caps 24 and sidewalls 27 when the etch front reaches them. The depth to which etching under these conditions may proceed into the narrow region between the nitride sidewalls 27 depends upon the width of the opening. For a base sidewall spacing of about 150 nm., polymer will pinch off the opening with about 200 nm of oxide remaining. The etching under the heavy polymer conditions of the first step is therefore stopped when the thickness of the residual oxide 38 reaches 200 nm or thereabout. The precise time of the first etching step must by determined by experiment and calibration. FIG. 4E is a cross section showing the contact profile at the termination of the first etching step. Thick polymer 36 protects the nitride cap 24 and exposed regions of the sidewalls 27. However, the area of residual oxide 38 exposed to the etchant gases begins to decrease.

The flow rates of the etchant gases are now altered to reduce the steady state thickness of polymer over the nitride surfaces and the second etch step is begun. This is accomplished by lowering the flow rate of $C_4F_8$ by about 10% and lowering the flow rate of $CH_3F$ by about 30%. The rf power is raised to about 1700 Watts or about 5.2 Watts/cm$^2$. The chamber pressure is kept between about 2 and 10 mTorr. Under these conditions the steady state polymer thickness is reduced sufficiently to permit the clearance of silicon oxide at the base of the contact opening.

The second etch step is continued with an allocated over etch period to assure thorough opening of all contacts across the wafer. During the over etch period some polymer build up occurs at the base of the opening as show in the cross section of FIG. 4F.

Upon completion of the second etch step, the gas flow in the RIE reactor is changed to oxygen for the removal of the residual polymer layer 36. The removal is accomplished by a three step ramp up of oxygen flow accompanied by a corresponding ramp down of rf power. A preferred ramping sequence is a first 5 minute period at an oxygen flow rate of 25 SCCM and an rf power of 150 Watts (0.46 Watts/cm$^2$) or thereabout, a second 5 minute period at an oxygen flow rate of 35 SCCM and an rf power of 125 Watts (0.39 Watts/cm$^2$) or thereabout, and a third 5 minute period at an oxygen flow rate of 100 SCCM and an rf power of 100 Watts (0.31 Watts/cm$^2$) or thereabout.

The use of a three step ramp up of oxygen flow and ramp down of rf power has the advantage of an initially high polymer removal rate. As the oxygen flow is increased and the power decreased, the polymer removal rate decreases. However, the loss of substrate material and infliction of substrate damage decreases as well. After the polymer removal procedure, residual photoresist is removed by oxygen plasma ashing. This is a conventional procedure and is generally administered in a separate plasma tool dedicated to photoresist removal.

Figure 4G:
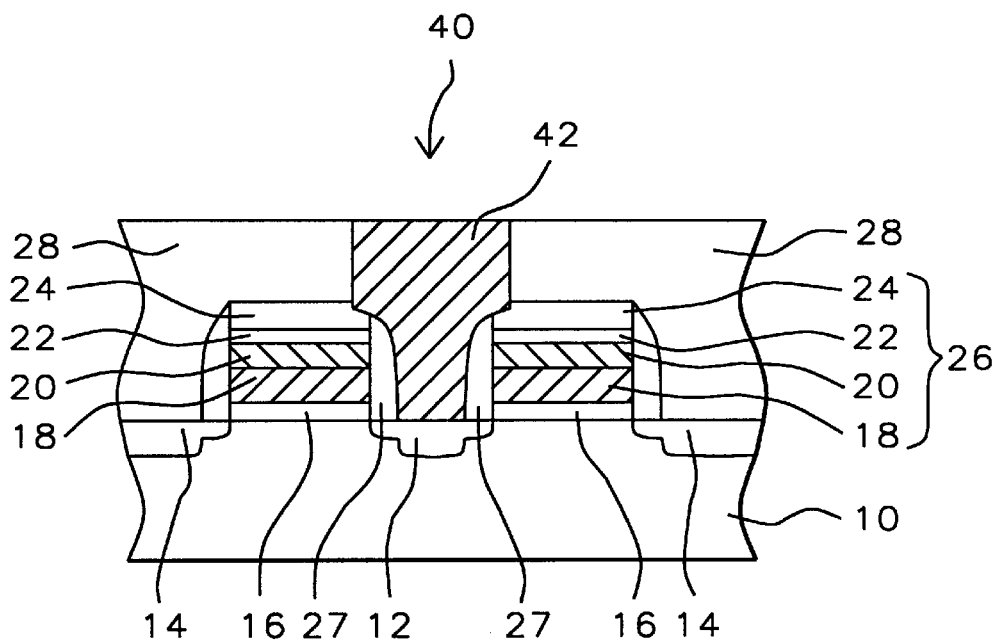

Referring now to FIG. 4G, a contact metallurgy 42, for example a tungsten, is next deposited into the SAC opening 40 using procedures well known by those in the art. Additional processing steps for forming a DRAM cell include the formation of bitlines over the insulator 28 and the formation of storage capacitors (not shown) in contact with the silicon active areas 14. These procedures are many and varied and are well known and understood by those in the art.

While the invention has been particularly shown and described with reference to the preferred embodiments thereof, it will be understood by those skilled in the art that various changes in form and details may be made without departing from the spirit and scope of the invention.

What is claimed is:

1. A method for forming a self-aligned contact to a semiconductor element adjacent to a gate electrode of a MOSFET comprising:

(a) providing a silicon wafer having a vertical walled gate stack with an insulative cap, a sidewall structure, and an active semiconductor element within the surface of said silicon wafer adjacent to said sidewall;

(b) depositing an insulative layer over said silicon wafer;

(c) planarizing said insulative layer;

(d) depositing a photoresist layer over said insulative layer;

(e) patterning said photoresist layer to define a contact opening;

(f) etching said insulative layer by RIE for a first time period in a first flow of fluorocyclobutane ($C_4F_8$) and $CH_3F$ in an argon carrier gas at a first rf power density whereby a polymer is formed over exposed silicon nitride surfaces;

(g) etching said insulative layer by RIE for a second time period in a second flow of fluorocyclobutane ($C_4F_8$) and $CH_3F$ in an argon carrier gas at a second rf power density wherein the second rf power density is higher than the first rf power density;

(h) removing residual polymer by flowing an oxidizing gas in a carrier gas in three stages with successively increasing oxygen flow rates and successively decreasing rf power densities, whereby residual polymer is cleared from said contact opening and said active semiconductor element is exposed;

(i) removing said photoresist layer by ashing; and (j) depositing a conductive material into said contact opening, thereby forming a self-aligned contact.

2. The method of claim 1 wherein said insulative layer is selected from the group consisting of silicon oxide, a phosphosilicate glass, and a borophosphosilicate glass.

3. The method of claim 1 wherein said insulative cap and said insulative sidewall structure is silicon nitride.

4. The method of claim 1 wherein the width of said contact opening at its base is between about 0.1 and 0.4 microns.

5. The method of claim 1 wherein the height of said vertical walled stack is between about 230 and 500 nm.

6. The method of claim 1 wherein the thickness of said sidewall structure at it's base is between about 50 and 100 nm.

7. The method of claim 1 wherein the thickness of said insulative cap is between about 150 and 250 nm.

8. The method of claim 1 wherein said first flow comprises $C_4F_8$ at a flow rate of between about 10 and 15 SCCM and $CH_3F$ at a flow rate of between about 8 and 15 SCCM.

9. The method of claim 1 wherein said second flow comprises $C_4F_8$ at flow rate of about 10 percent of the flow rate of $C_4F_8$ in said first flow and $CH_3F$ at about a flow rate of about 30 percent of the flow rate of $CH_3F$ in said first flow.

10. The method of claim 1 wherein said first rf power density is 4.6 Watts/$cm^2$ or thereabout.

11. The method of claim 1 wherein said second rf power density is 5.2 Watts/$cm^2$ or thereabout.

12. The method of claim 1 wherein the flow rate of said argon carrier gas is adjusted to maintain a total chamber pressure of between about 2 and 10 mTorr.

13. The method of claim 1 wherein said successively increasing oxygen flow rates are 25, 35, and 100 SCCM or thereabout respectively and said successively decreasing rf power densities are 0.46, 0.39, and 0.31 Watts/$cm^2$ or thereabout respectively.

14. A method for forming a DRAM cell structure having a self-aligned bitline contact to a semiconductive element between two adjacent wordlines comprising:

(a) providing a silicon wafer having a gate oxide layer subjacent to a conductive layer;

(b) depositing a silicon oxide layer over said conductive layer;

(c) depositing a first silicon nitride layer, over said silicon oxide layer;

(d) depositing and patterning a first photoresist layer to define a plurality of wordlines;

(e) anisotropically etching said first silicon nitride layer, said silicon oxide layer, and said conductive layer thereby forming wordlines;

(f) implanting a first dose of impurity atoms;

(g) removing said first photoresist layer;

(h) depositing a second silicon nitride layer;

(i) anisotropically etching said second silicon nitride layer thereby forming silicon nitride sidewalls adjacent to said wordlines;

(j) implanting a second dose of impurity atoms thereby forming a semiconductive element;

(k) depositing an insulative layer over said silicon wafer;

(l) planarizing said insulative layer;

(m) depositing a second photoresist layer over said insulative layer;

(n) patterning said second photoresist layer to define a bitline contact openings between adjacent wordlines;

(o) etching said insulative layer by RIE for a first time period in a first flow of fluorocyclobutane ($C_4F_8$) and $CH_3F$ in an argon carrier gas at a first rf power density whereby a polymer is formed over exposed silicon nitride surfaces;

(p) etching said insulative layer by RIE for a second time period in a second flow of fluorocyclobutane ($C_4F_8$) and $CH_3F$ in an argon carrier gas at a second rf power density thereby forming bitline contact openings wherein the second rf power density is higher than the first rf power density;

(q) removing residual polymer by flowing an oxidizing gas in a carrier gas in three stages with successively increasing oxygen flow rates and successively decreasing rf power densities;

(r) removing said photoresist layer by ashing;

(s) depositing conductive material into said bitline contact openings, thereby forming bitline contacts;

(t) forming a bitline over said bitline contact; and (u) forming storage capacitors.

15. The method of claim 14 wherein said insulative layer is selected from the group consisting of silicon oxide, a phosphosilicate glass, and a borophosphosilicate glass.

16. The method of claim 14 wherein the width of said bitline contact openings is between about 0.1 and 0.4 microns.

17. The method of claim 14 wherein the thickness of said silicon nitride sidewalls is between about 50 and 100 nm.

18. The method of claim 14 wherein the distance between adjacent wordlines is between about 0.18 and 0.35 microns.

19. The method of claim 14 wherein said first flow comprises $C_4F_8$ at a flow rate of between about 10 and 15 SCCM and $CH_3F$ at a flow rate of between about 8 and 15 SCCM.

20. The method of claim 14 wherein said second flow comprises $C_4F_8$ at flow rate of about 10 percent of the flow rate of $C_4F_8$ in said first flow and $CH_3F$ at about a flow rate of about 30 percent of the flow rate of $CH_3F$ in said first flow.

21. The method of claim 14 wherein said first rf power density is 4.6 Watts/cm$^2$ or thereabout.

22. The method of claim 14 wherein said second rf power density is 5.2 Watts/cm$^2$ or thereabout.

23. The method of claim 14 wherein the flow rate of said argon carrier gas is adjusted to maintain a total chamber pressure of between about 2 and 10 mTorr.

24. The method of claim 14 wherein said successively increasing oxygen flow rates are 25, 35, and 100 SCCM or thereabout respectively and said successively decreasing rf power densities are 0.46, 0.39, and 0.31 Watts/cm$^2$ or thereabout respectively.

25. The method of claim 14 wherein said conductive material is tungsten.

* * * * *